United States Patent
Kenyon

(10) Patent No.: US 10,395,070 B2
(45) Date of Patent: Aug. 27, 2019

(54) PEAK DETECTOR CIRCUIT

(71) Applicant: TEXAS INSTRUMENTS INCORPORATED, Dallas, TX (US)

(72) Inventor: Eleazar Walter Kenyon, Tucker, GA (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 43 days.

(21) Appl. No.: 15/808,607

(22) Filed: Nov. 9, 2017

(65) Prior Publication Data

US 2019/0138758 A1 May 9, 2019

(51) Int. Cl.
| | |
|---|---|
| *H03K 5/153* | (2006.01) |
| *G06G 7/25* | (2006.01) |
| *G01R 19/04* | (2006.01) |
| *H03K 5/1532* | (2006.01) |
| *H05B 33/08* | (2006.01) |
| *H02J 7/00* | (2006.01) |
| *G01R 19/00* | (2006.01) |

(52) U.S. Cl.
CPC ............. *G06G 7/25* (2013.01); *G01R 19/003* (2013.01); *G01R 19/04* (2013.01); *H02J 7/0077* (2013.01); *H03K 5/1532* (2013.01); *H05B 33/08* (2013.01)

(58) Field of Classification Search
CPC ........ G06G 7/25; G01R 19/003; G01R 19/04; H02J 7/0077; H03K 5/1532; H05B 33/08
USPC .......................................................... 327/58
See application file for complete search history.

(56) References Cited

U.S. PATENT DOCUMENTS

| | | | |
|---|---|---|---|
| 2008/0116966 A1* | 5/2008 | Chae ................. | H03H 19/004 327/554 |
| 2016/0103158 A1* | 4/2016 | Gravati ................ | G01R 19/04 324/103 P |

* cited by examiner

*Primary Examiner* — Metasebia T Retebo
(74) *Attorney, Agent, or Firm* — John R. Pessetto; Charles A. Brill; Frank D. Cimino

(57) ABSTRACT

A peak detector circuit includes a first capacitor coupled to an inverter and a first switch in parallel with the inverter. An input of the inverter couples to second and third switches. The second switch couples to an input voltage node. The third switch couples to an output voltage node of the peak detector circuit. The peak detector circuit includes a second capacitor coupled to the third switch and a third capacitor coupled to the second capacitor by way of a fourth switch. The third capacitor couples via a fifth switch to a power supply voltage node or a ground. A periodic control signal causes the first, second, and third switches to repeatedly open and close and a second control signal causes the fourth and fifth switches to open and close to adjust an output voltage on the output voltage node towards an input voltage on the input voltage node.

18 Claims, 3 Drawing Sheets

PEAK DETECTOR CIRCUIT

BACKGROUND

Some peak detectors using convention rectifier topologies include a device such as a diode that demonstrates an exponential voltage-to-current characteristic to rectify the signal. If complementary metal oxide semiconductor (CMOS) transistor devices are used in the peak detector, the CMOS transistors must be operated in the subthreshold region to exhibit the desired exponential behavior. For high speed applications, the use of CMOS transistors operating in the subthreshold region may not be practical due to large power requirements and large CMOS transistor sizes required to implement such peak detectors. Additionally, such peak detectors require calibration of the input to output characteristic to account for random and systematic offsets which have become worse as smaller and smaller devices are used to implement such circuits.

SUMMARY

In one embodiment, a peak detector circuit includes, a first capacitor coupled to an inverter and a first switch coupled in parallel to the inverter. An input of the inverter is coupled to second and third switches. The second switch is coupled to an input voltage node and the third switch is coupled to an output voltage node of the peak detector circuit. The peak detector circuit further includes a second capacitor coupled to the third switch and a third capacitor coupled to the second capacitor by way of a fourth switch, The third capacitor is coupled via a fifth switch to either a power supply voltage node or a ground. A periodic control signal causes the first, second, and third switches to repeatedly open and close and wherein a second control signal causes the fourth and fifth switches to open and close to adjust an output voltage on the output voltage node towards an input voltage on the input voltage node.

In another embodiment, a peak detector circuit includes a comparator configured to compare an input voltage to an output voltage of the peak detector to thereby generate a compare output signal. A latch is included and is configured to generate a first control signal responsive to a logic level of the comparator output signal. The peak detector circuit further includes a first capacitor coupled to the comparator by way of a first switch. The output voltage represents the voltage on a plate of the first capacitor. A second capacitor is coupled to the first capacitor by way of a second switch controlled by the first control signal from the latch. Responsive to the compare output signal indicating the input voltage is greater than the output voltage, the latch asserts the first control signal to a logic level that causes the second switch to close to thereby cause the second capacitor to deliver charge to the first capacitor thereby increasing the output voltage.

A peak detector circuit includes a first switch to receive an input voltage, a first capacitor coupled to the first switch, and an inverter coupled to the first capacitor. The peak detector circuit further includes a second switch coupled to an input of the inverter and an output of the inverter, a second capacitor, a third switch coupled between the second capacitor and the first capacitor, a third capacitor, a fourth switch coupled between the second and third capacitors, and a latch coupled between the output of the inverter and the fourth switch.

BRIEF DESCRIPTION OF THE DRAWINGS

For a detailed description of various examples, reference will now be made to the accompanying drawings in which.

DETAILED DESCRIPTION

In accordance with the disclosed embodiments, a peak detector circuit includes a comparator that compares an input voltage to an output voltage of the peak detector. As a positive peak detector circuit, the output voltage is incrementally increased during successive reset and sample phases until the output voltage reaches the input voltage. The output voltage in the disclosed examples is incremented by transferring charge from a first capacitor to a second capacitor. The first capacitor is selectively coupled to a supply voltage by a first switch and also selectively coupled to the second capacitor by a second switch. If the output voltage is determined to be less than the input voltage by the comparator, the first switch is opened and the second switch is closed to thereby transfer charge from the first capacitor to the second capacitor. As a result, the voltage on the second capacitor, which is the output voltage, is increased.

During the reset phase, the output voltage is coupled by way of a switch closure to a capacitor within the comparator, and during a subsequent sample phase, the output voltage is decoupled from the comparator's capacitor and the input voltage is instead coupled to the comparator's capacitor. The sequence of the reset phase followed by the sample phase is repeated under control of a period clock signal. Once the output voltage reaches and begins to exceed the input voltage, the second switch coupling together the first and second capacitors remains open to cause the output voltage to remain approximately constant even if the input voltage begins to decrease. However, the first switch closes to permit the first capacitor to be charged in anticipation of a state in which Vin is again greater than Vout. A negative peak detector implementation is also disclosed herein. The embodiments described herein include transistors operating as switches and not in the subthreshold region and a self-calibrated inverter is used in place of a traditional analog comparator. As a result, the circuit achieves low random and systematic offsets using only minimum geometry digital gates and analog passive devices while requiring low power and silicon area, making it a favorable architecture for deep submicron CMOS processes.

Figure 1:
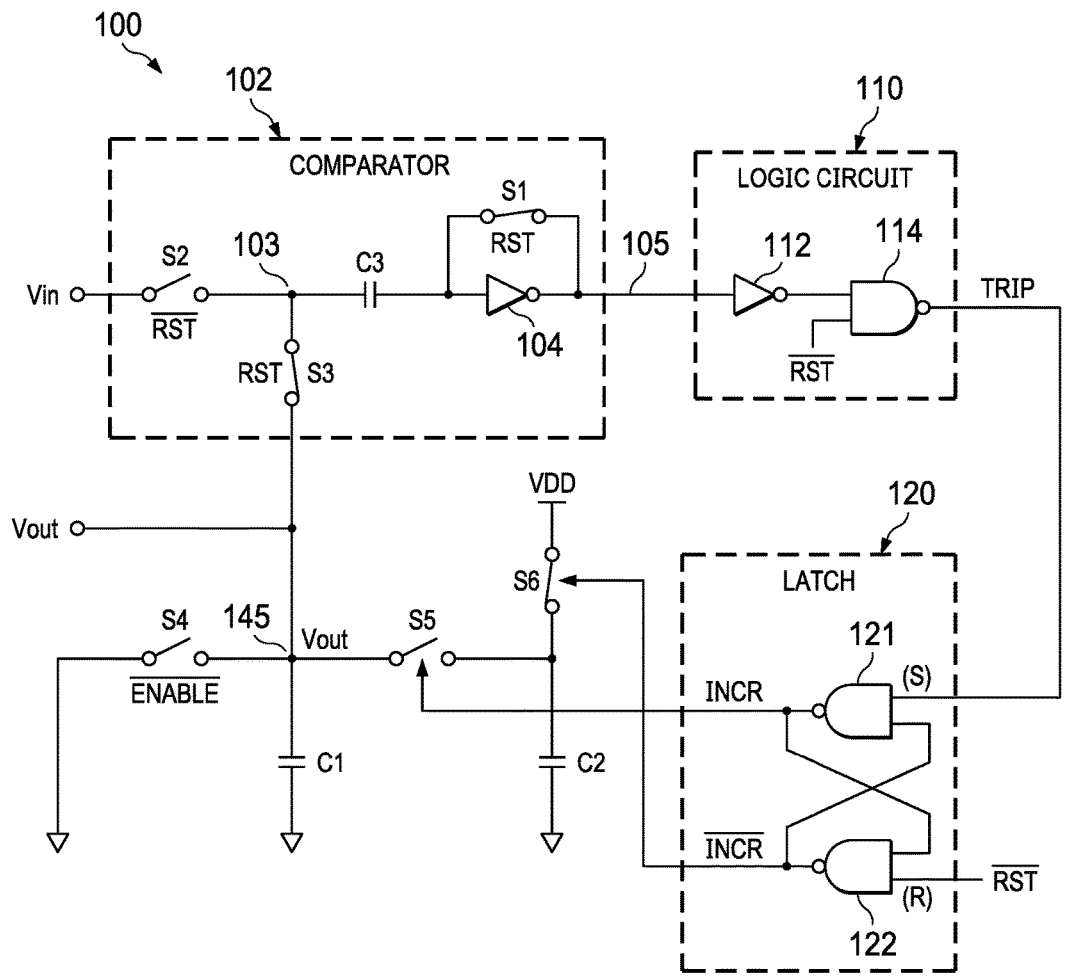
FIG. 1 illustrates an example of a peak detector circuit during a reset mode of operation.
Figure 4:
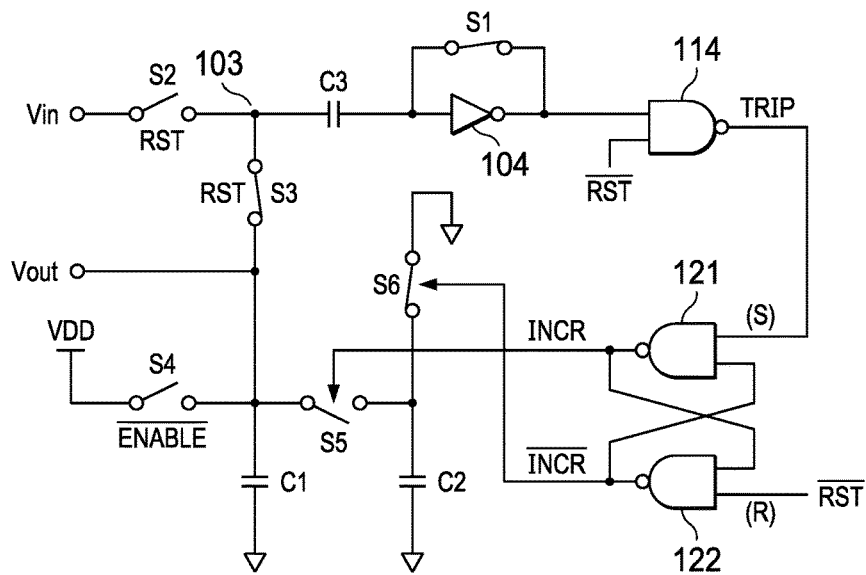
FIG. 4 shows an alternative embodiment of a negative peak detector.

FIG. 1 shows an example of a peak detector circuit 100. In this example, the peak detector circuit 100 includes multiple transistors operating as switches, capacitors, inverters, and other logic components. The peak detector circuit 100 includes a comparator 102, a logic circuit 110, a latch 120, capacitors C1 and C2, and switches S4, S5, and S6. An input signal, Vin, is provided to the comparator 102, and an output signal, Vout, represents the voltage at node 145 (i.e., the voltage on one of the plates of capacitor C1 as shown). The output voltage, Vout, is the detected peak of the input voltage, Vin. The example of FIG. 1 shows an implementation of the peak detector circuit 100 as a positive peak detector in which Vout tracks the positive peak voltage of Vin. FIG. 4, described below, shows an example of a negative peak detector in which Vout tracks the negative peak voltage of Vin.

As shown in this example, the comparator 102 includes, switches S1, S2, and S3, capacitor C3, and an inverter 104. In other embodiments, either or both of the switches S2 and S3 can be considered as separate from, but coupled to, the comparator 102. The switches S1-S3 are controlled based on a periodic control signal (e.g., a clock signal) designated as reset (RST) in FIG. 1. The names of the signals adjacent each switch in the figures designates the polarity of the corresponding signal to turn on (i.e., close) the switch. For example, switches S1 and S3 are turned on (i.e., closed) by a positive polarity of RST (as indicated by "RST" listed adjacent S1 and S3), while switch S2 is turned on by a negative polarity of RST (as indicated by "$\overline{RST}$" listed adjacent S1 and S3). The reset signal RST is a periodic signal may be generated external to the peak detector, but provided to the peak detector for controlling the switches S1-S3.

Switch S2 receives the input voltage Vin, and also couples to capacitor C1 at node 103. Switch S3 couples to capacitor C1 and, at node 103, to capacitor C3. The capacitor C3 couples to an input of inverter 104, and switch S1 couples between the input of the inverter 104 and the inverter's output (i.e., in parallel with the inverter 104). The output of inverter 104 generates a compare output signal 105 and is coupled to the logic circuit 110. In this example, the logic circuit 110 includes an inverter 112 coupled to a logic gate shown as a NAND gate 114 in FIG. 1. The inverter 112 inverts the logic state of the signal 105 and provides the inverted signal to an input of the NAND gate 114. The NAND gate 114 thus receives a logic signal indicative of the compare output signal 105. Another input of the NAND gate 114 receives the $\overline{RST}$ signal (the inverted RST signal). The output of the NAND gate 114 is designated as the TRIP signal and is provided to the latch 120. The latch 120 in the example of FIG. 1 comprises an SR latch with TRIP provided to one of the inputs and $\overline{RST}$ provided to the other latch input as shown. The latch 120 is implemented as an SR latch and includes a pair of cross-coupled NAND gates 121 and 122 as shown. TRIP is provided to an S input of NAND gate 121 and $\overline{RST}$ is provided to an R input of NAND gate 122. The output of NAND gate 121 is designated as the increment signal (INCR) and is provided to the other input of NAND gate 122. Similarly, the output of NAND gate 122 is designated as the inverted increment signal ($\overline{INCR}$) (i.e., the opposite polarity as INCR) and is provided to the other input of NAND gate 121.

The INCR signal is used to control the operating state of switch S5 and $\overline{INCR}$ is used to control the operating state of switch S6, which is coupled to a power supply node which produces voltage VDD. Thus, when switch S5 is open, switch S6 is closed, and vice versa. Switch S4 is an enable switch and is coupled to node 145, and node 145 provides the output signal Vout from the peak detector. The other terminal of switch S4 is pulled low to ground and thus pulls Vout low when switch S4 is closed thereby disabling the output of the peak detector from tracking Vin. When S4 is open, the peak detector is enabled and Vout is caused to track Vin. The switch S4 is controlled by an enable signal ($\overline{ENABLE}$), which in this example is active low meaning that a low for the enable signal opens switch S4 and a high closes the switch.

The peak detector circuit 100 illustrated in FIG. 1 operates in cyclical manner. Each cycle includes a detect phase followed by a sample phase, and the cycles repeat (reset phase, sample phase, reset phase, sample phase, and so on). Once the peak detector circuit 100 is enabled by opening switch S4, through the cyclical operation of the peak detector circuit, the output voltage Vin is iteratively adjusted towards the input voltage Vin. For positive peak detect operation (as is the case for FIG. 1), the output voltage initially starts at a level that is lower than Vin (e.g., Vout starts at 0 V with S4 closed) and Vout is incrementally increased upward with each cycle until the Vout approximately equals Vin. If Vin then continues to increase, Vout also is increased. However, if Vin decreases, Vout is not decreased and remains at the previous level of Vin before Vin decreased. This process continues until the circuit is disabled at which time S4 is closed thereby forcing Vout low.

Figure 2:
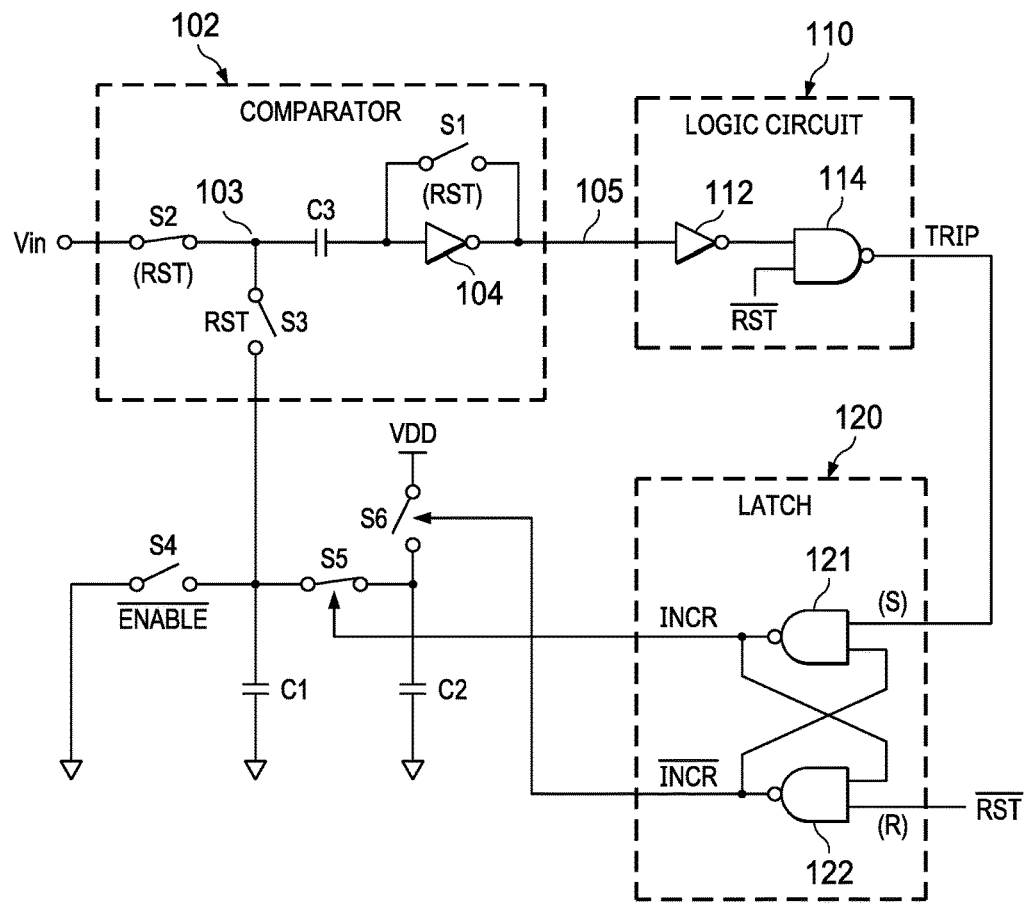
FIG. 2 illustrates the peak detector circuit during a sample mode of operation.

FIG. 1 shows the state of the switches during the reset phase of operation, and FIG. 2 shows the state of the switches during the sample phase of operation. Referring first to FIG. 1, during the reset phase, S1 and S3 are closed and S2 is open. In this switch configuration, Vout is provided to node 103 and thus to capacitor C3. As S1 is closed, the input and output of the inverter 104 are connected together thereby causing the output of the inverter 104 to produce a signal 105 that is at a voltage that is in between a logic low and a logic high. With S3 closed, the voltage on node 103 is Vout. Accordingly, a voltage is developed across C3 that is the difference between Vout and the intermediate voltage on the inverter's input caused by the closure of switch S1. During the reset phase, RST is high and thus $\overline{RST}$ is low. With the $\overline{RST}$ input to NAND gate 114 being low, TRIP is forced high. The S and R inputs to the latch 120 are 1 and 0, respectively, which forces INCR to be low and $\overline{INCR}$ to be high. As a result, S5 is open and S6 is closed. Closing S6 during the reset phase causes C2 to be charged by VDD, while the voltage on C2 is decoupled from C1 due to S5 being open. Thus, in the reset phase, C2 is charged and Vout is provided to node 103 within the comparator 102. In some embodiments, the capacitance value of C1 is smaller than the capacitance value of C2.

During the subsequent sample phase as shown in FIG. 2, switches S1 and S3 are opened and S2 is closed due to RST being low. Opening S3 and closing S2 decouples Vout from node 103 and couples Vin to node 103. If Vin is greater than Vout, then the voltage on the left-hand plate of C3 (at node 103) increases from Vout to Vin. This increase in voltage causes the voltage on the right-hand plate of C3 (input to inverter 104) to increase thereby causing the inverter to register a high on its input. With the inverter's input being a logic high, its output signal 105 is forced low. With the input signal 105 to inverter 112 being low, the output signal from inverter 112 to NAND gate 114 is a logic high. The other input to NAND gate 114 is $\overline{RST}$, which is a logic high (since RST is low during the sample phase). With both inputs to NAND gate 114 at a logic high level, the NAND gate's output signal TRIP is low. TRIP being low thus indicates that Vout is less than Vin. The S input to the latch is a 0 (TRIP), and the R input ($\overline{RST}$) is a 1. As such, the INCR signal from the latch is forced high and $\overline{INCR}$ is forced low. With INCR being high and $\overline{INCR}$ being low, switch S6 is open and S5 is closed.

By closing S5, charge from C2 is transferred to C1 thereby increasing the voltage on C1. During the sample phase, the voltage on C1 (i.e., Vout) is increased but is decoupled from node 103 within the comparator due to S3 being open. Thus, Vout has been increased to be used during the subsequent reset phase. The process repeats with S1-S3 reconfigured for the reset phase (S1 and S3 closed and S2 open) to charge capacitor C3 to the newly increased Vout voltage on C1. Capacitor C2 also is charged in the event that Vin is still determined to be greater than Vout and the voltage on C1 (Vout) needs to be further increased. If Vin is still greater than Vout when S1-S3 are configured for the sample phase (S2 closed and S1 and S3 open), then the output signal 105 from comparator 102 will again be a logic low, which through logic circuit 110, will force TRIP to be a 0 and additional charge from C2 will be transferred from C2 to C1 to further increase Vout.

If Vout was greater than Vin (e.g., either due to Vout being incrementally increased or Vin dropping), during the sample phase the comparator's output signal 105 will be a logic high which through logic circuit 110 causes TRIP to be a logic high. With both TRIP and $\overline{RST}$ being high during the sample phase with Vout being greater than Vin, the latch 120 does not change its INCR and $\overline{INCR}$ output signals and thus INCR remains a logic one causing S5 to remain open from the previous reset phase, and $\overline{INCR}$ remains a logic one causing C2 to charge or keep its charge from VDD. In this state, Vout remains approximately constant.

Figure 3:
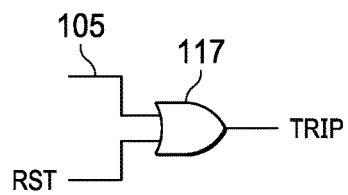
FIG. 3 shows an alternative embodiment of a logic circuit usable in the peak detector circuit.

FIG. 1 shows an example of a logic circuit 110 comprising inverter 112 and NAND gate 114. Other configurations of logic circuits are possible to generate the TRIP signal based on the comparator's output signal 105 (which indicates whether Vin is greater than or smaller than Vout) and the RST signal. FIG. 3 shows an example of a logic circuit 110 comprising an OR gate 117. One input to OR gate 117 is the comparator's output signal 105. Instead of $\overline{RST}$ being another input to the OR gate, RST also is an input to OR gate 117. The output signal from OR gate 117 is TRIP and, like the logic circuit 110 of FIG. 1, TRIP is asserted high when RST is high and TRIP is asserted low when both RST is low and signal 105 is low.

FIG. 4 shows an example of a negative peak detect circuit. The circuit example of FIG. 4 is similar to that of FIGS. 1 and 2 but with the following differences. The enable switch S4 is coupled to VDD instead of ground to force the output voltage Vout to start from a high voltage level and be decreased downward toward Vin. Further, switch S6 is coupled to ground instead of VDD to permit charge from C1 to be transferred to C2 during each reset phase as the circuit incrementally lowers Vout towards Vin. Also, inverter 112 from FIG. 1 is not included in FIG. 4. In this embodiment, TRIP is asserted when Vin is less than Vout, which causes Vout to be decremented until Vin is no longer less then Vout.

Figure 5:
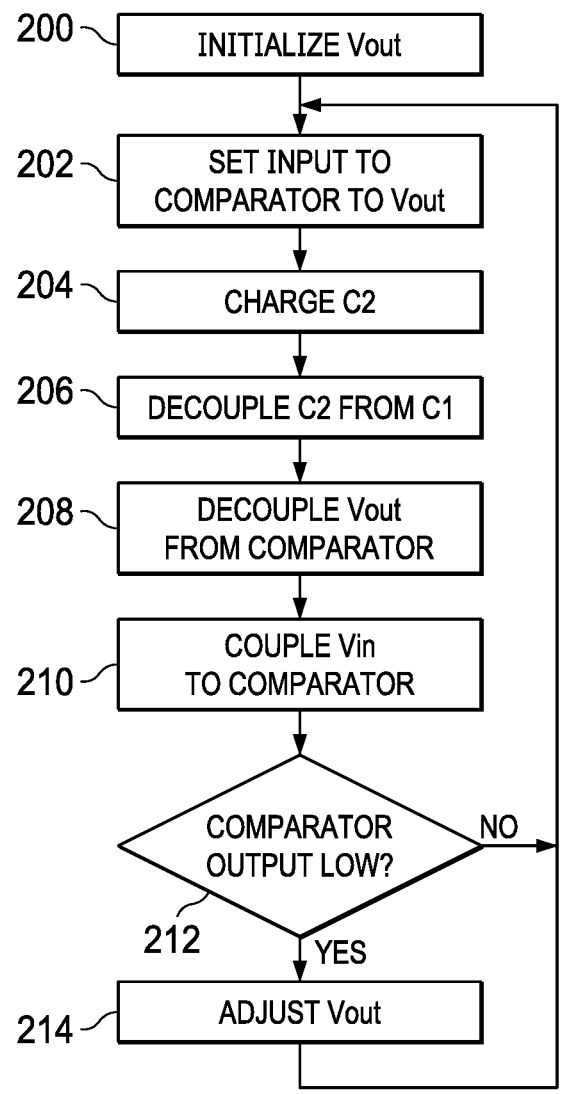
FIG. 5 illustrates a method in accordance with an embodiment.

FIG. 5 illustrates a method for using the peak detector circuit 100. At 200, Vout is initialized. This operation may be performed by closing switch S4 to force Vout to a logic low as in FIG. 1 (or closing S4 to force Vout as in FIG. 4). Operations 202-214 illustrate the cyclical operation of the peak detector circuit to cause Vout to be adjusted towards Vin.

At 202, the method includes setting an input to the comparator (e.g., node 103) to the output voltage. This operation may comprise closing S3 and opening S2 as is illustrated in FIG. 1. Then, capacitor is charged to VDD at 204 and the voltage on C2 is decoupled from C1 at 206 through operation of switches S6 and S5 as explained above.

At 208, Vout is decoupled from the comparator and the input voltage Vin is coupled to the comparator's input at 210. These operations may include opening S3 and closing S2. At 212, the comparator 102 determines whether Vin is greater or less than Vout and generates a corresponding output signal. If the output signal is low (e.g., indicative of Vin being greater than Vout, then at 214, the method includes adjusting the Vout. Operation 214 may include opening switch S6 and closing S5 to permit charge from C2 to be transferred to C1 to thereby boost Vout and the process repeats at operation 202. Otherwise, if the comparator output signal is high (indicative of Vin being less than Vout), then the process repeats at operation 202 without further adjustment to Vout.

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . . " Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors. References to the adjectives "first," "second," "third," etc. does not impart any significance other than distinguishing one feature from another. Further, the terms "open" and "on" are synonymous when referring to the operating state of solid-state switch herein. Similarly, the terms "closed" and "off" are synonymous when referring to the operating state of solid-state switches.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A peak detector circuit, comprising:
   a comparator configured to compare an input voltage to an output voltage of the peak detector circuit to thereby generate a compare output signal;
   a latch configured to generate a first control signal responsive to a logic level of the comparator output signal;
   a first capacitor coupled to the comparator by way of a first switch, wherein the output voltage represents the voltage on a plate of the first capacitor; and
   a second capacitor coupled to the first capacitor by way of a second switch controlled by the first control signal from the latch;
   wherein, responsive to the compare output signal indicating the input voltage is greater than the output voltage, the latch asserts the first control signal to a logic level that causes the second switch to close to thereby cause the second capacitor to deliver charge to the first capacitor thereby increasing the output voltage;
   further comprising a third switch coupled to the input voltage, wherein:
   during a reset phase of operation of the peak detector circuit, the third switch is open and the first switch is closed to provide the output voltage to a node of the comparator; and
   during a sample phase of operation of the peak detector circuit, the third switch is closed and the first switch is opened to provide the input voltage to the node of the comparator.

2. The peak detector circuit of claim 1, wherein the first and third switches are configured to be repeatedly opened and closed during the reset and sample phases.

3. A peak detector circuit, comprising:
a comparator configured to compare an input voltage to an output voltage of the peak detector circuit to thereby generate a compare output signal;
a latch configured to generate a first control signal responsive to a logic level of the comparator output signal;
a first capacitor coupled to the comparator by way of a first switch, wherein the output voltage represents the voltage on a plate of the first capacitor; and
a second capacitor coupled to the first capacitor by way of a second switch controlled by the first control signal from the latch;
wherein, responsive to the compare output signal indicating the input voltage is greater than the output voltage, the latch asserts the first control signal to a logic level that causes the second switch to close to thereby cause the second capacitor to deliver charge to the first capacitor thereby increasing the output voltage;
wherein the comparator includes:
a third capacitor;
an inverter having an input and an output, wherein the input is coupled to the third capacitor; and
a third switch coupled in parallel with the inverter, wherein when the third switch is closed, the input of the inverter is coupled to an output of the inverter through the third switch thereby maintaining a voltage on the input and output of the inverter between a logic low and a logic high of the inverter.

4. A peak detector circuit, comprising:
a comparator configured to compare an input voltage to an output voltage of the peak detector circuit to thereby generate a compare output signal;
a latch configured to generate a first control signal responsive to a logic level of the comparator output signal;
a first capacitor coupled to the comparator by way of a first switch, wherein the output voltage represents the voltage on a plate of the first capacitor; and
a second capacitor coupled to the first capacitor by way of a second switch controlled by the first control signal from the latch;
wherein, responsive to the compare output signal indicating the input voltage is greater than the output voltage, the latch asserts the first control signal to a logic level that causes the second switch to close to thereby cause the second capacitor to deliver charge to the first capacitor thereby increasing the output voltage;
further comprising a third switch coupling the second capacitor to a power supply voltage or a ground, and wherein the latch generates a second control signal responsive to the logic level of the comparator output signal, wherein the second control signal is of an opposite polarity as the first control signal, and wherein the first control signal controls the second switch and the second control signal controls the third switch.

5. A peak detector circuit, comprising:
a comparator configured to compare an input voltage to an output voltage of the peak detector circuit to thereby generate a compare output signal;
a latch configured to generate a first control signal responsive to a logic level of the comparator output signal;
a first capacitor coupled to the comparator by way of a first switch, wherein the output voltage represents the voltage on a plate of the first capacitor; and
a second capacitor coupled to the first capacitor by way of a second switch controlled by the first control signal from the latch;
wherein, responsive to the compare output signal indicating the input voltage is greater than the output voltage, the latch asserts the first control signal to a logic level that causes the second switch to close to thereby cause the second capacitor to deliver charge to the first capacitor thereby increasing the output voltage;
further comprising a logic gate configured to receive a logic signal indicative of the compare output signal and to receive a reset signal, and wherein the logic gate generates a signal to the latch indicative of whether the input voltage is greater or less than the output voltage.

6. The peak detector circuit of claim 5, wherein the logic gate comprises at least one of a NAND gate and an OR gate.

7. A peak detector circuit, comprising:
a first switch to receive an input voltage;
a first capacitor coupled to the first switch;
an inverter coupled to the first capacitor;
a second switch coupled to an input of the inverter and an output of the inverter;
a second capacitor;
a third switch coupled between the second capacitor and the first capacitor;
a third capacitor;
a fourth switch coupled between the second and third capacitors; and
a latch coupled between the output of the inverter and the fourth switch;
wherein the latch comprises an SR latch.

8. A peak detector circuit, comprising:
a first switch to receive an input voltage;
a first capacitor coupled to the first switch;
an inverter coupled to the first capacitor;
a second switch coupled to an input of the inverter and an output of the inverter;
a second capacitor;
a third switch coupled between the second capacitor and the first capacitor;
a third capacitor;
a fourth switch coupled between the second and third capacitors; and
a latch coupled between the output of the inverter and the fourth switch;
further comprising a logic gate coupled between the inverter and the latch.

9. The peak detector circuit of claim 8, wherein the logic gate comprises a NAND gate.

10. A peak detector circuit, comprising:
a first switch to receive an input voltage;
a first capacitor coupled to the first switch;
an inverter coupled to the first capacitor;
a second switch coupled to an input of the inverter and an output of the inverter;
a second capacitor;
a third switch coupled between the second capacitor and the first capacitor;
a third capacitor;
a fourth switch coupled between the second and third capacitors; and
a latch coupled between the output of the inverter and the fourth switch;
further comprising a fifth switch coupled between the third capacitor and a power supply node.

11. A peak detector circuit, comprising:
a first switch to receive an input voltage;
a first capacitor coupled to the first switch;
an inverter coupled to the first capacitor;

a second switch coupled to an input of the inverter and an output of the inverter;
a second capacitor;
a third switch coupled between the second capacitor and the first capacitor;
a third capacitor;
a fourth switch coupled between the second and third capacitors; and
a latch coupled between the output of the inverter and the fourth switch;
further comprising a fifth switch coupled between the third capacitor and a ground.

12. A peak detector circuit, comprising:
a first switch to receive an input voltage;
a first capacitor coupled to the first switch;
an inverter coupled to the first capacitor;
a second switch coupled to an input of the inverter and an output of the inverter;
a second capacitor;
a third switch coupled between the second capacitor and the first capacitor;
a third capacitor;
a fourth switch coupled between the second and third capacitors; and
a latch coupled between the output of the inverter and the fourth switch;
wherein charge from the third capacitor is used to boost a voltage on the second capacitor until the voltage on the second capacitor matches the input voltage.

13. A peak detector circuit, comprising:
a first capacitor coupled to an inverter;
a first switch coupled in parallel to the inverter;
an input of the inverter coupled to second and third switches, wherein the second switch is coupled to an input voltage node and the third switch is coupled to an output voltage node of the peak detector circuit;
a second capacitor coupled to the third switch; and
a third capacitor coupled to the second capacitor by way of a fourth switch, wherein the third capacitor is coupled via a fifth switch to either a power supply voltage node or a ground;
wherein a periodic control signal causes the first, second, and third switches to repeatedly open and close and wherein a second control signal causes the fourth and fifth switches to open and close to adjust an output voltage on the output voltage node towards an input voltage on the input voltage node.

14. The peak detector circuit of claim 13, further comprising a logic gate configured to receive a signal indicative of an output signal of the inverter and configured to receive a signal indicative of the periodic control signal.

15. The peak detector circuit of claim 14, further comprising a latch coupled to an output of the logic gate, wherein the latch generates the second control signal.

16. The peak detector circuit of claim 14, further comprising a latch coupled to an output of the logic gate, wherein the latch generates a first latch control signal and a second latch control signal, wherein the second latch control signal is of the opposite polarity as the first latch control signal, wherein the first and second latch control signals represent the second control signal, and wherein the first latch control signal controls the fourth switch and the second latch control signal controls the fifth switch.

17. The peak detector circuit of claim 13, further comprising a sixth switch coupled the second capacitor and to either a power supply voltage or ground, wherein when closed the sixth switch forces the voltage on the second capacitor to either a power supply voltage or ground.

18. The peak detector circuit of claim 13, wherein the second capacitor has a capacitance value that is smaller than a capacitance value of the third capacitor.

* * * * *